(12) United States Patent
Joshi et al.

(10) Patent No.: US 8,975,961 B2
(45) Date of Patent: Mar. 10, 2015

(54) POWER AMPLIFIER CONTROL CIRCUITS

(71) Applicant: Texas Instruments Incorporated, Dallas, TX (US)

(72) Inventors: Alok Prakash Joshi, Thane (IN); Gireesh Rajendran, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 11 days.

(21) Appl. No.: 13/902,389

(22) Filed: May 24, 2013

(65) Prior Publication Data

US 2014/0347124 A1    Nov. 27, 2014

(51) Int. Cl.
*H03F 3/45*    (2006.01)

(52) U.S. Cl.
USPC .............. 330/254; 330/195; 330/127; 330/51

(58) Field of Classification Search
USPC ................................... 330/254, 195, 127, 51
IPC ......................................................... H03F 3/45
See application file for complete search history.

(56) References Cited

U.S. PATENT DOCUMENTS

| | | | | |
|---|---|---|---|---|
| 3,546,610 A | * | 12/1970 | Checinski | 330/11 |
| 4,030,015 A | * | 6/1977 | Herko et al. | 363/16 |
| 6,160,455 A | * | 12/2000 | French et al. | 330/297 |
| 6,169,681 B1 | * | 1/2001 | Kemp et al. | 363/98 |
| 8,212,613 B1 | * | 7/2012 | Hsieh | 330/10 |
| 8,456,867 B1 | * | 6/2013 | Karlsson et al. | 363/17 |
| 8,665,025 B2 | * | 3/2014 | Cabrera et al. | 330/273 |
| 2011/0074509 A1 | | 3/2011 | Samavedam et al. | |

FOREIGN PATENT DOCUMENTS

| | | |
|---|---|---|
| WO | 2009 065068 | 5/2009 |
| WO | 2009 126386 | 10/2009 |
| WO | 2009 137160 | 11/2009 |

* cited by examiner

*Primary Examiner* — Patricia Nguyen
(74) *Attorney, Agent, or Firm* — Ronald O. Neerings; Frederick J. Telecky, Jr.

(57) ABSTRACT

Circuits for reducing power consumption in power amplifier circuits are disclosed. In certain embodiments, a circuit for power control in the transmitter includes a coupling circuit, a first power amplifier circuit and a second power amplifier circuit. The coupling circuit includes a primary winding inductively associated with a first secondary winding and a second secondary winding. The coupling circuit provides a signal at output terminals of the first secondary winding and the second secondary winding in response to a signal at the primary winding. A first power amplifier circuit is coupled with output terminals of the first secondary winding, and a second power amplifier is coupled with output terminals of the second secondary winding. The first power amplifier circuit and second power amplifier circuit are configured to be enabled or disabled based on a bias voltage.

20 Claims, 5 Drawing Sheets

POWER AMPLIFIER CONTROL CIRCUITS

TECHNICAL FIELD

The present disclosure relates to power amplifier control circuits.

BACKGROUND

Wireless communication has changed the way people communicate and transfer data between devices. As more electronic devices are enabled for wireless and mobile communication, increasing the operational power efficiency of such devices is becoming increasingly important. In accordance with an example scenario, transmitter circuitry is associated with a major percentage of energy requirement in such communication systems. For instance, Radio-Frequency (RF) transmission consumes considerable power, and a contributing factor to such power consumption is inefficient power amplifier operation in the RF transmitter circuitry. Indeed, one example scenario provides that most of the energy is used by the power amplifiers in the RF transmitter circuitry. In view of the potential benefit of optimizing power efficiency in electronic devices having wireless capabilities, it is beneficial that transmitters deploying power amplifiers are as energy-efficient as possible.

SUMMARY

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter.

Circuits for power control of a power amplifier circuit in a transmitter are disclosed. In an embodiment, a circuit is disclosed that includes a coupling circuit, a first power amplifier circuit and a second power amplifier circuit. The coupling circuit includes a primary winding, a first secondary winding and a second secondary winding. The first secondary winding and the second secondary winding are inductively associated with the primary winding. The coupling circuit is configured to provide a signal at output terminals of the first secondary winding and the second secondary winding in response to an input signal received at the primary winding. The first power amplifier circuit is coupled with output terminals of the first secondary winding, and the second power amplifier circuit is coupled with output terminals of the second secondary winding. Each power amplifier circuit is configured to be enabled (e.g., switched "ON") or disabled (e.g., switched "OFF") based on a bias voltage applied at a corresponding secondary winding.

In some embodiments, a transmitter circuit includes a coupling circuit and a plurality of power amplifier circuits. The coupling circuit includes a primary winding and a plurality of secondary windings. The primary winding is inductively associated with the plurality of secondary windings. The coupling circuit is configured to provide a signal at output terminals of the plurality of secondary windings in response to an input signal received at the primary winding. A plurality of power amplifier circuits is coupled with output terminals of the plurality of secondary windings. Each power amplifier circuit is configured to be enabled (e.g., switched "ON") or disabled (e.g., switched "OFF") based on a bias voltage applied at a corresponding secondary winding.

DETAILED DESCRIPTION

Figure 1:
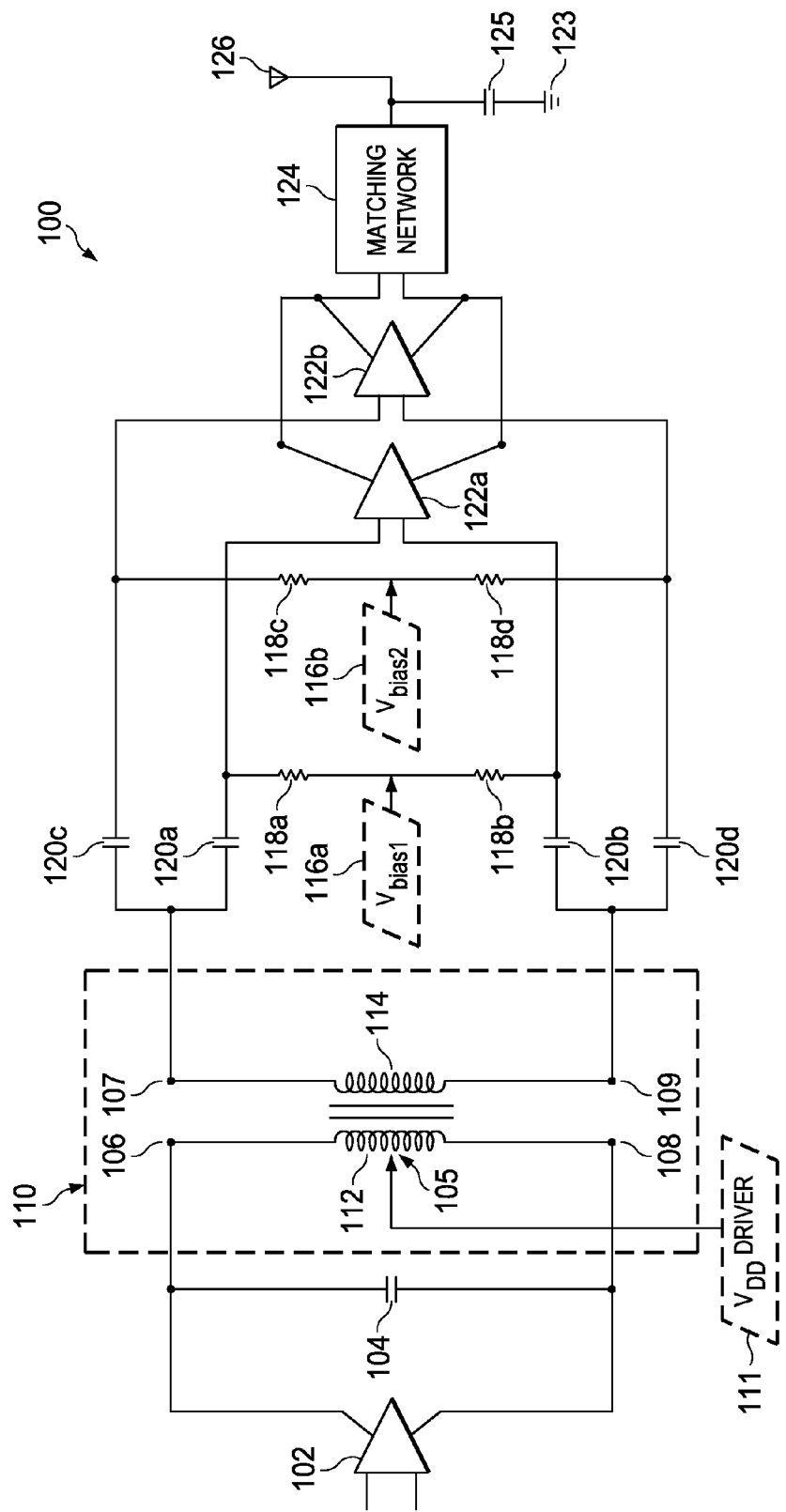
FIG. 1 is a circuit diagram of a circuit configured for power control of power amplifiers in a transmitter according to an example scenario.

Pursuant to an example scenario, a transmitter includes multiple power amplifiers that generate signals to be transmitted from an antenna. In a case, where a receiver is in close proximity of the transmitter, only few power amplifiers are capable of generating the required signal strength. However, in various cases, all of the power amplifiers present in the transmitter are turned ON that causes unnecessary power consumption. Referring to FIG. 1, an example scenario is shown where a couple of power amplifiers are coupled with a driver circuit, such as a power amplifier driver with the help of a coupling circuit. As shown in FIG. 1, a circuit 100 has a power amplifier driver 102 and a coupling circuit 110. The coupling circuit 110 includes a driver winding 112 (i.e. a primary winding coupled between input terminals 106 and 108) coupled with outputs of the power amplifier driver 102. A tuning circuit 104 is coupled between the terminals 106 and 108 of the coupling circuit 110. The coupling circuit 110 includes a power amplifier winding 114 (i.e., a secondary winding coupled between terminals 107 and 109) that is coupled with power amplifiers 122a and 122b. The driver winding 112 is inductively associated with the power amplifier winding 114. The driver winding 112 includes a center tap 105 connected to a voltage signal received from a VDD driver 111. A first power amplifier 122a is coupled to the power amplifier winding 114 by means of capacitors 120a and 120b. A second power amplifier 122b is coupled to the power amplifier winding 114 by means of capacitors 120c and 120d. A first bias voltage 116a (for example, Vbias1) is provided to the first power amplifier 122a by means of resistors 118a and 118b. Similarly, the second power amplifier 122b is provided with a second bias voltage 116b (for example, Vbias2) by means of resistors 118c and 118d. The power amplifiers 122a and 122b are coupled to a matching network 124 like a resistive network or a filter network. An output of the matching network 124 is fed to an antenna 126 like a dipole antenna, and the like. A capacitor 125 is coupled between the output of the matching network 124 and ground 123 to filter out any harmonic emissions generated by the circuit 100.

The bias voltages, such as the first bias voltage (see, Vbias1) 116a and the second bias voltage (see, Vbias2) 116b, are used to temporarily turn OFF either the first power amplifier 122a or the second power amplifier 122b, respectively, depending upon a requirement of a signal strength to be radiated from the antenna 126. In some applications, power required to transmit the signal from the antenna 126 is less such that the required power is generated by turning ON either the first power amplifier 122a or the second power amplifier 122b. In cases, when the signal is being transmitted to a distant receiver, both of the power amplifiers 122a and 122b are enabled to meet the power requirement. The bias voltage (e.g. Vbias1, Vbias2) is selectively set to zero Volt (V) to power OFF either of the power amplifiers 122a or 122b.

In the example scenario shown in FIG. 1, there is an Alternating Current (AC) coupling between the power amplifier winding 114 and the power amplifiers 122a and 122b, through the capacitances 120a-120d. Such AC coupling introduces parasitic capacitances that increase the power consumption of the power amplifiers 122a and 122b. The current consumed by the power amplifier driver 102 increases due to the capacitances 120a-120d. The large parasitic capacitance introduced by capacitors 120a-120d, reduces the inductance of the coupling circuit 110. The equivalent parallel resistances of the windings 112 and 114 decrease with decrease in the inductance of the coupling circuit 110. The gain of the power amplifier driver 102 reduces with the decrease in equivalent parallel resistances of the windings 112 and 114 for the same transconductance of the power amplifier driver 102. Such increased power consumption by the power amplifier driver 102 is a significant concern in wireless communication devices like wireless modems, mobile phones and laptops.

Figure 2:
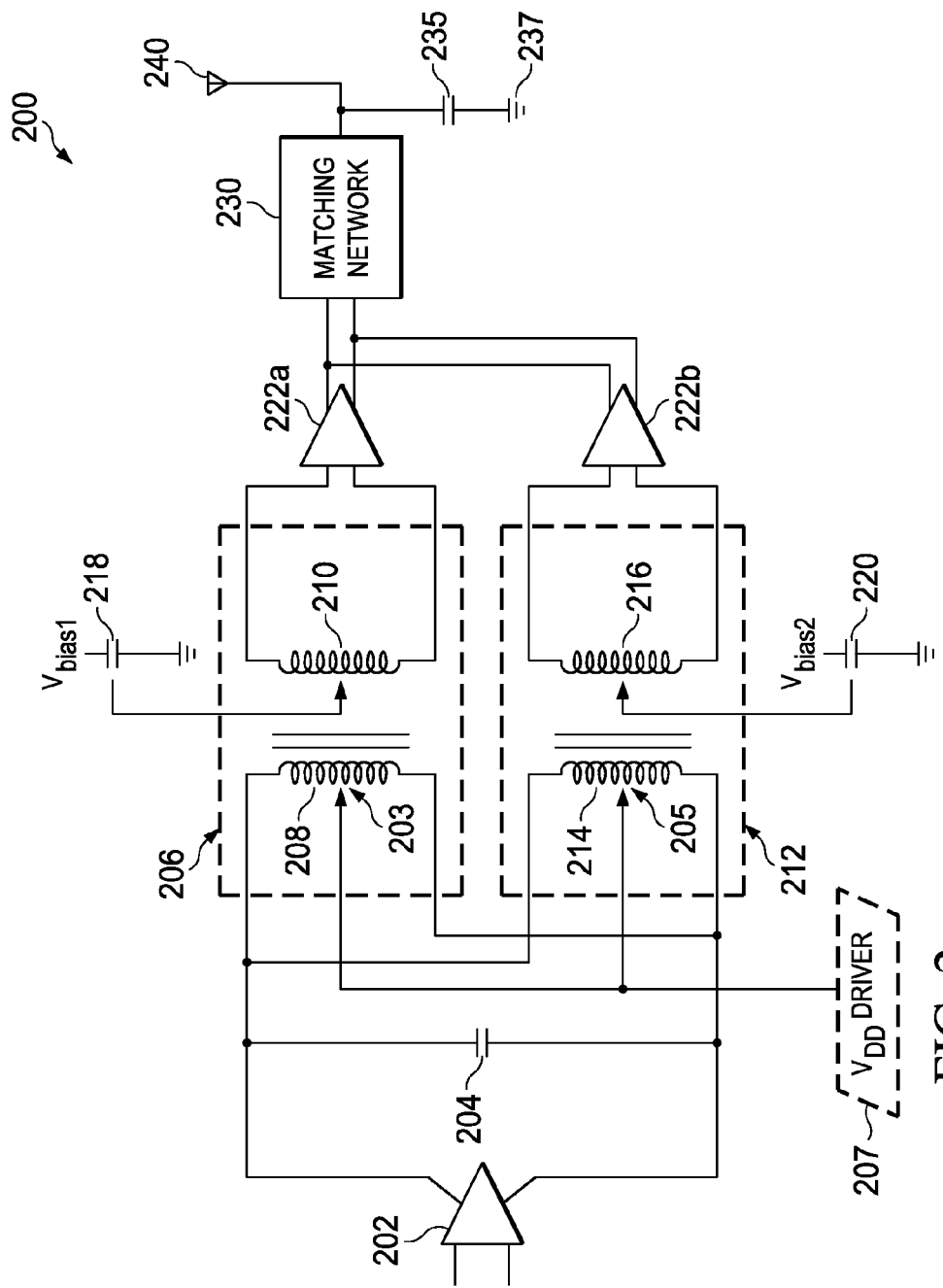
FIG. 2 is a circuit diagram of a circuit configured for power control of power amplifiers in a transmitter according to another example scenario.

Another example circuit for power control in power amplifier circuits is depicted in FIG. 2, in accordance with another example scenario. As depicted in FIG. 2, a circuit 200 for power control includes a power amplifier driver circuit 202, a tuning circuit 204, a first coupling circuit 206 including a first driver winding 208 and a first power amplifier winding 210, a second coupling circuit 212 including a second driver winding 214 and a second power amplifier winding 216, a first power amplifier 222a, a second power amplifier 222b, a matching network 230, a capacitor 235 and an antenna 240.

The power amplifier driver circuit 202 provides a signal to the first driver winding 208 of the first coupling circuit 206 and the second driver winding 214 of the second coupling circuit 212. The signal is inductively coupled from the first driver winding 208 of the first coupling circuit 206, to the first power amplifier winding 210 of the first coupling circuit 206. The second driver winding 214 inductively couples the signal to the second power amplifier winding 216 of the second coupling circuit 212. A voltage signal received from a VDD driver 207 is applied at center taps 203 and 205 of the driver windings 208 and 214, respectively. The first power amplifier 222a is provided a signal from output terminals of the first power amplifier winding 210 and the second power amplifier 222b receives the signal from the second power amplifier winding 216. Amplified signals from the power amplifiers 222a and 222b are provided to the matching network 230, which is coupled to the antenna 240. The capacitor 235, coupled between the antenna 240 and ground 237, eliminates the harmonic emissions introduced by the circuit 200. A first bias voltage 218 (e.g., Vbias1) for the first power amplifier 222a is provided at a center tap of the first power amplifier winding 210. The second power amplifier 222b is provided with a second bias voltage 220 (e.g., Vbias2), at the center tap of the second power amplifier winding 216. In this example scenario, a zero bias voltage (see, Vbias1, Vbias2) is provided at the center taps of power amplifier windings 210 and 216, respectively, to switch OFF the corresponding power amplifiers 222a and 222b. The first power amplifier 222a or the second power amplifier 222b are not required to be functional when the transmitting antenna 240 is close to a receiver and either of the amplifiers 222a and 222b are powered OFF to save power. Such powering OFF the power amplifiers 222a and 222b helps in reducing power consumption of the power amplifier driver circuit.

The use of two different coupling circuits 206 and 212, to couple the power amplifier driver circuit 202 with the power amplifiers 222a and 222b increases the passive area of the circuit 200. The power amplifier driver circuit 202 coupled to the first driver winding 208 and the second driver winding 214 results in signal loss at the input terminal of the driver windings 208 and 214 due to plus and minus crossings of the driver windings 208 and 214.

Various embodiments of the present technology provide solutions that are capable of reducing power consumption associated with power amplifiers in transmitter circuitries, and these solutions overcome the above described and other limitations, in addition to providing currently unavailable benefits. Various embodiments of the present technology are herein disclosed in conjunction with FIGS. 3-5.

Figure 3:
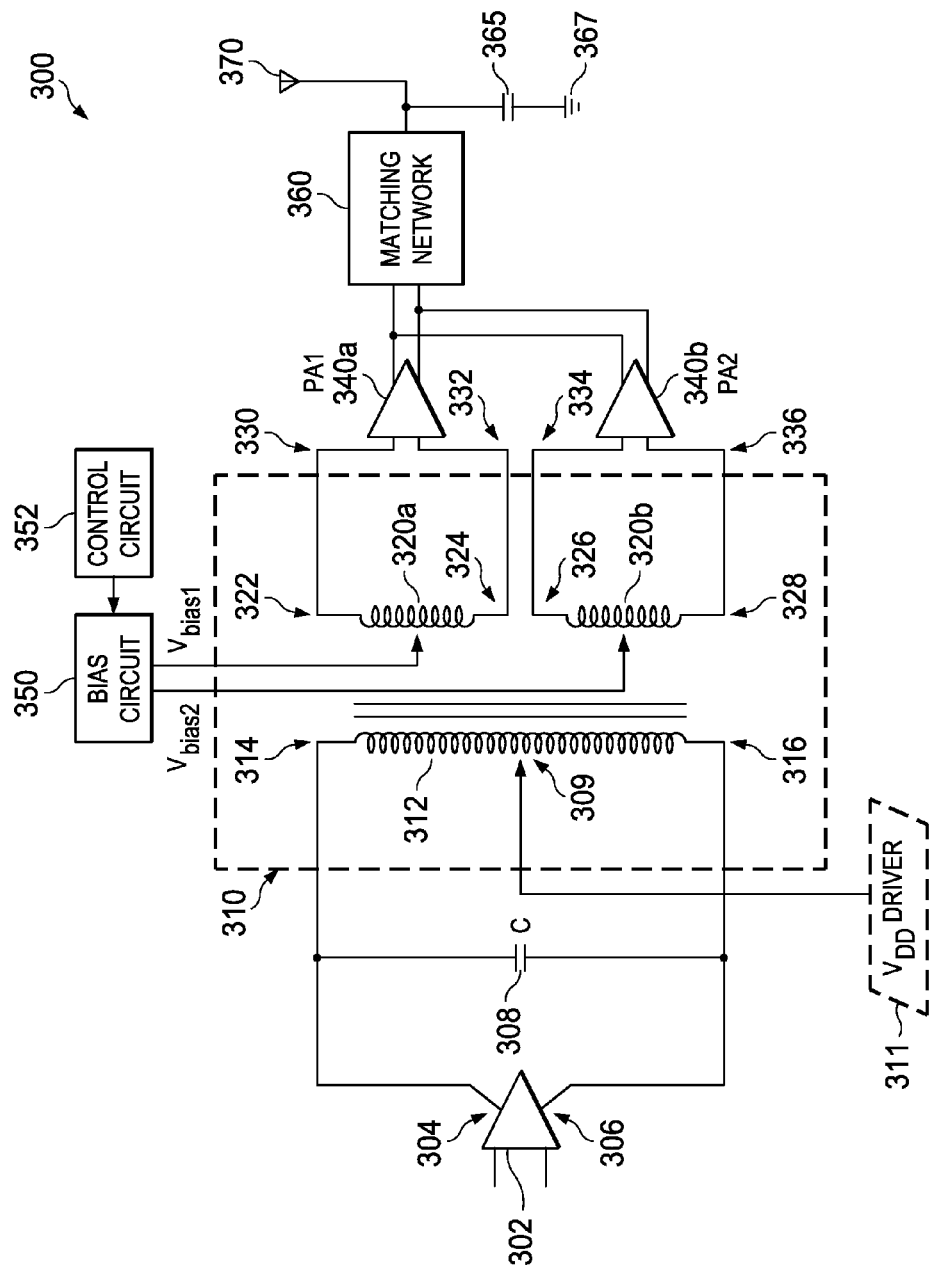
FIG. 3 is a circuit diagram of a circuit configured for power control of power amplifier circuits in a transmitter according to an embodiment.

FIG. 3 illustrates a circuit 300 for power control of power amplifier circuits in a transmitter according to an embodiment of the present technology. The circuit 300 includes a coupling circuit 310, a first power amplifier circuit 340a (shown as, PA1) and a second power amplifier circuit 340b (shown as, PA2). It should be noted that the circuit 300 represents a transmitter circuit and only those components of the transmitter circuit are shown and described that are required for the description of embodiments of the present technology, and accordingly, the circuit 300 is also referred to as a transmitter circuit 300. The coupling circuit 310 is configured to couple an input signal from input terminals 314 and 316 of the coupling circuit 310 to output terminals of the coupling circuit 310. In an example, the coupling circuit 310 includes a primary winding 312, and two secondary windings, for example, a first secondary winding 320a and a second secondary winding 320b. In an example, the coupling circuit 310 is configured using a balun having coils wound around a core to form the primary winding 312, the first secondary winding 320a and the second secondary winding 320b. The coupling circuit 310 is also configured as a transformer including inductive coils (e.g., the primary winding 312 and the secondary windings 320a and 320b) wound on a core. The primary winding 312 couples the input signal inductively from input terminal (i.e., a positive input terminal 314 and a negative input terminal 316) of the primary winding 312 to output terminals (i.e., a positive terminal 322 and a negative terminal 324) of the first secondary winding 320a. The primary winding 312 also couples the input signal inductively from the input terminals (i.e., the positive input terminal 314 and the negative input terminal 316) of the primary winding 312 to output terminal (i.e., a positive terminal 326 and a negative terminal 328) of the second secondary winding 320b. It should be noted that the in some scenarios, signal at the output terminals (output terminals 322 and 324 of the first secondary winding 320a and output terminals 326 and 328 of the second secondary winding 320b) of the secondary windings 320a and 320b are at different voltage levels but primarily will be the same signal. The primary winding 312 has a center tap 309 that is provided a voltage signal from a VDD driver 311. The VDD driver 311 provides a signal which is out of phase at the positive input terminal 314 and the negative input terminal 316 of the primary winding 312. It should be noted that the coupling circuit 310 shown in the FIG. 3 is for example purposes only, and the coupling circuit 310 is configured in a variety of other ways, such as by utilizing a specific circuit element or combinations of circuit elements such as amplifiers, diodes, capacitors, resistors, and the like.

In comparison to the circuit 200 of FIG. 2, the circuit 300 for power control utilizes a single coupling circuit 310 to couple the signal from the input terminals (i.e., the positive input terminal 314 and the negative input terminal 316) of the primary winding 312 to the output terminals (i.e., the positive terminals 322 and 326, the negative terminals 324, 328) of the secondary windings 320a and 320b, which reduces the passive area occupied by the coupling circuit 310. The complexity of the circuit 200 introduced by multiple coupling circuits 206 and 212 as seen in FIG. 2, are eliminated by the use of the coupling circuit 310 having the primary winding 312 and the secondary windings 320a and 320b.

The PA1 and the PA2 are Radio Frequency (RF) power amplifiers, and are connected to output terminals of the coupling circuit 310. For example, input terminals (a first terminal 330 and a second terminal 332) of the PA1 are coupled to output terminals (the positive terminal 322 and the negative terminal 324) of the first secondary winding 320a. Similarly, input terminals (a first terminal 334 and a second terminal 336) of the PA2 are coupled to output terminals (the positive terminal 326 and the negative terminal 328) of the second secondary winding 320b. In various embodiments, the PA1 and PA2 are configured in a variety of ways, such as by utilizing a specific circuit element or combination of circuit elements such as transistor amplifiers, operational amplifiers, differential amplifiers, vacuum amplifiers, microwave amplifiers or combinations of circuit elements (e.g., amplifiers, diodes, capacitors, resistors, and the like. The PA1 and the PA2 are configured to convert a low power radio frequency signal (received from the secondary windings 320a and 320b, respectively) to an amplified signal of significant power. The PA1 and PA2 are operated either in Class A, Class B, Class AB, Class C, Class D or Class H modes of operation based on a transistor bias voltage and the input signal. The PA1 and the PA2 are enabled/disabled (switched ON/OFF) based on bias voltages supplied to the PA1 and PA2.

As discussed with reference to the circuit 100 of FIG. 1, Direct Current (DC) coupling of the secondary windings (320a and 320b) of the coupling circuit 310 with the PA1 and the PA2 reduces the parasitic capacitance of the circuit 300. The reduction of parasitic capacitances in the circuit 300 increases the gain of the circuit 300. The inductive coupling of the signal from the primary winding 312 to the secondary windings 320a and 320b is greatly enhanced due to the absence of capacitances (such as capacitances 120a-120d in FIG. 1) in the circuit 300.

In one embodiment, the circuit 300 includes a driver circuit 302 and a bias circuit 350. The driver circuit 302 has a positive output terminal 304 and a negative output terminal 306. The positive output terminal 304 is coupled to the positive input terminal 314 of the primary winding 312, and the negative output terminal 306 is coupled to the negative input terminal 316 of the primary winding 312. The driver circuit 302 is an electrical circuit or an electronic component that accepts signals and provides the signals to the PA1 and PA2 for further transmission. The driver circuit 302 is configured in a variety of ways, such as by utilizing a specific circuit element or combinations of circuit elements (e.g., amplifiers, diodes, inductors, capacitors, resistors, and the like). In an embodiment, the driver circuit 302 is a power amplifier driver that increases the signal strength and provides it to the primary winding 312. The DC coupling of the secondary windings (320a and 320b) with the PA1 and the PA2 reduces the current consumption of the driver circuit 302.

The circuit 300 also includes a tuning circuit 308 coupled between the positive output terminal 304 and the negative output terminal 306 of the driver circuit 302. The tuning circuit 308 is configured to improve the noise performance associated with the coupling of the driver circuit 302 with the PA1 and the PA2. In the embodiment shown in FIG. 3, the tuning circuit 308 is shown as a capacitor (see, C); however, this should not be considered as limiting the scope of the present technology. Moreover, the tuning circuit 308 is implemented using other types of electronic components, such as, for example, resistors, inductors and other resonant circuits.

The bias circuit 350 is configured to selectively provide bias voltages to the secondary windings 320a and 320b to control ON/OFF of the PA1 and the PA2. For instance, the bias circuit 350 provides a first bias voltage (see, Vbias1 in FIG. 3) to enable and disable (control ON/OFF) the PA1 and a second bias voltage (see, Vbias2 in FIG. 3) to enable and disable (control ON/OFF) the PA2. In an embodiment, the first bias voltage is applied at the center tap of the first secondary winding 320a for the PA1 and the second bias voltage is applied at the center tap of the second secondary winding 320b for the PA2. The bias circuit 350 provides the bias voltages to establish a predetermined voltage at the center tap of the first secondary winding 320a and the second secondary winding 320b.

In some embodiments, the bias voltages are controlled by a control circuit 352. The control circuit 352 is coupled to the bias circuit 350 and the control circuit 352 is configured to control the first bias voltage provided to the first secondary winding 320a and the second bias voltage provided to the second secondary winding 320b. The PA1 is disabled (switched OFF) when the first bias voltage applied at the center tap of the first secondary winding 320a is of zero voltage. Similarly, the PA2 is switched OFF when the Vbias2 applied at the center tap of the second secondary winding 320b is of zero voltage. It should be noted that other voltages such as a negative supply is used as the Vbias1 and Vbias2 to switch OFF the PA1 and PA2, instead of the zero voltages. In various embodiments, the control circuit 352 is configured in a variety of ways, such as by utilizing a combination of circuit elements (e.g., amplifiers, diodes, capacitors, resistors, and the like) or a combination of various circuitries.

In some embodiment, the circuit 300 also includes a matching network 360, a filter circuit such as a capacitor 365 and an antenna 370. Examples of the matching network 360 include, but are not limited to, a resistive network, a reactive network and a filter network. Outputs of the PA1 and the PA2 are coupled to the matching network 360 so that the matching network 360 is configured to provide the amplified signal (received from the PA1 and the PA2) to an input terminal of the antenna 370. The matching network 360 is configured in a variety of ways, such as by utilizing a specific circuit element or combinations of circuit elements (e.g., inductors, capacitors, resistors and the like). The capacitor 365 coupled between the antenna 370 and ground 367, eliminates the harmonic emissions introduced by the circuit 300. The capacitor 365 reduces the bandwidth of the amplified signals transmitted without loss of information by eliminating the harmonic emissions of the circuit 300. The antenna 370 converts the amplified signal into radio waves and radiates energy in the form of electromagnetic waves. Examples of the antenna 370 include, but are not limited to, a wire antenna, a microstrip antenna, a reflector antenna, a travelling wave antenna, an aperture antenna, and a log periodic antenna.

When an input signal is transmitted to a receiver in a close proximity, an amplification provided by either the PA1 or the PA2 would suffice. For instance, when power provided by the PA1 would be sufficient to transmit the input signal, the PA2 is powered OFF to reduce the power consumption of power amplifier circuits (the PA1 and the PA2). The second bias voltage (Vbias2) is set to zero voltage at the center tap of the secondary winding 320b to switch OFF the PA2. For example, if the input signal has to be transmitted to a node at a distance of 100 meter from the antenna 370, the power required by the antenna 370 is 13 (decibel decibel-milliwatt) dBm, which is provided by the PA1. This requires the control circuit 352 to provide the Vbias1 as 0.5 V (only an indicative number) to the center tap of the secondary winding 320a and a zero voltage as the Vbias1. The Vbias1 powers ON the PA1 to amplify the input signal to be transmitted and powers OFF the PA2. This reduces the power consumption of power amplifier circuitry by switching OFF the PA2. It should be noted that the bias circuit 350 and the control circuit 352 is configured in a variety of ways using voltage converters, voltage regulators, transistors, amplifiers, diodes and other passive devices, and the like.

The transmission of an input signal to a distant node requires more power, the amplification provided by the PA1 and the PA2 are needed. This necessitates switching ON both the power amplifier circuits (the PA1 and the PA2). For example, if the node is at a distance of 100 kilometers from the antenna 370, the power required is 250 dBm. The control circuit 352 directs the bias circuit 350 to provide the Vbias1 of 0.5V and the Vbias1 of 0.5V to the PA2. The power amplifier circuits (PA1 and PA2) are enabled (switched ON) though the respective secondary windings (320a and 320b) by the bias circuit 350, and the PA1 and the PA2 provide the necessary power for the input signal to be transmitted to the distant node.

The driver circuit 302, the coupling circuit 310, the power amplifier circuits 340a and 340b, the matching network 360 and the antenna 370 is implemented as interconnections of electronic elements and circuits, and modules such as an Application Specific Integrated Circuit (ASIC), a Field Programmable Gate Array (FPGA), and the like. It should be noted that there are more than two power amplifiers present in the transmitter circuitry and are controlled for reducing power consumption therein, by utilizing various embodiments of the present technology. Another such example embodiment of a circuit for reducing power consumption of power amplifiers in a transmitter is further described in conjunction with FIG. 4 according to an embodiment.

Figure 4:
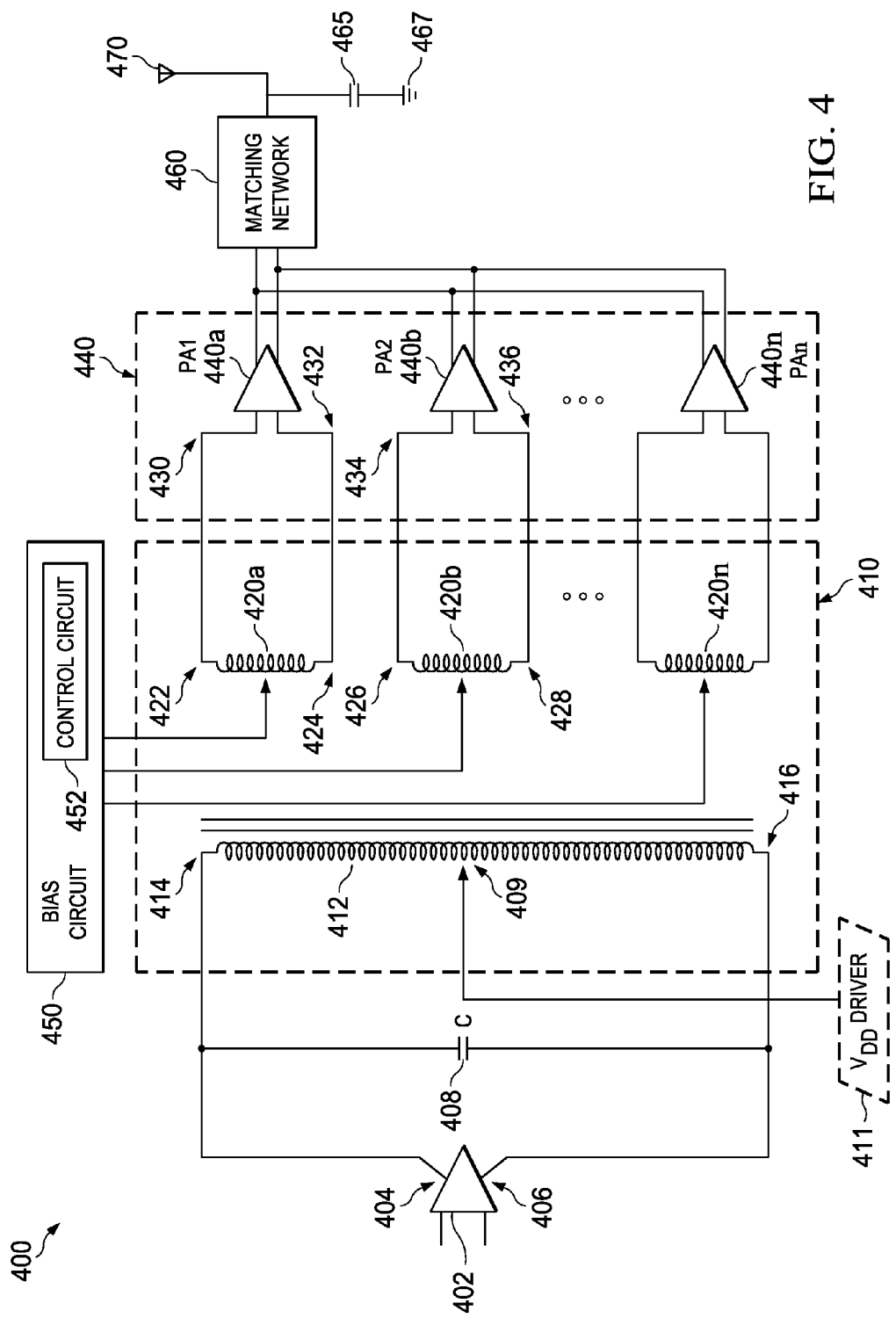
FIG. 4 is a circuit diagram of a transmitter circuit configured for power control of power amplifier circuits according to an embodiment.

With reference to FIG. 4, a circuit 400 (for example, a transmitter circuit 400) shows a coupling circuit 410 coupled to a plurality of power amplifier circuits (see, 440a-440n) for power control in a transmitter. The coupling circuit 410 includes a primary winding 412 and a plurality of secondary windings 420a-420n inductively coupled to the primary winding 412. The coupling circuit 410 is configured to provide a signal at output terminals of the plurality of secondary windings 420a-420n in response to an input signal at a positive input terminal 414 and a negative input terminal 416 of the primary winding 412. The coupling circuit 410 is, for example, a balun or a transformer.

The plurality of power amplifier circuits 440a-440n, are audio power amplifiers or video power amplifiers. The plurality of power amplifier circuits 440a-440n, is coupled to the output terminals of the plurality of secondary windings 420a-420n. For example, terminals 430 and 432 of a first power amplifier circuit 440a is coupled to output terminals (a positive terminal 422 and a negative terminal 424) of a first secondary winding 420a of the plurality of secondary windings 420a-420n, and terminals 434 and 436 of a second power amplifier circuit 440b is coupled to output terminals (a positive terminal 426 and a negative terminal 428) of a second secondary winding 420b, and so on.

The circuit 400 also includes a driver circuit 402 coupled to input terminals of the coupling circuit 410. For example, output terminals (a positive output terminal 404 and a negative output terminal 406) of the driver circuit 402 are coupled to the input terminals (the positive input terminal 414 and the negative input terminal 416) of the primary winding 412. Examples of the driver circuit 402 include, but are not limited to, audio power amplifier driver and RF power amplifier driver. The primary winding 412 has a center tap 409 that is provided with a VDD driver 411. The voltage signal provides out of phase signals of same magnitude at the positive input terminal 414 and the negative input terminal 416 of the primary winding 412. The circuit 400 also includes a tuning circuit 408 for coupling the driver circuit 402 with the plurality of power amplifier circuits 440a-440n. The tuning circuit 408 is coupled between the output terminals (the positive output terminal 404 and the negative output terminal 406) of the driver circuit 402. The tuning circuit 408, for example, a capacitor (see, C) as shown in FIG. 4 or a parallel combination of inductor and capacitor.

Each power amplifier circuit of the plurality of power amplifier circuits 440a-440n, is switched ON/OFF based on a power requirement of the input signal to be transmitted. For example, the power amplifier circuit 440a alone is enabled when the input signal is transmitted to a receiver in a close proximity. The power amplifier circuits 440b-440n are powered OFF. A bias circuit 450 provides bias voltages which control power ON/OFF of the plurality of power amplifier circuits 440a-440n. The bias circuit 450 selectively provides a bias voltage to each secondary winding of the plurality of secondary windings 420a-420n at a center tap of each secondary winding. For example, the bias circuit 450 provides a bias voltage for the power amplifier circuit 440a at the center tap of the secondary winding 420a to control ON/OFF of the power amplifier circuit 440a, and so on. The bias circuit 450 include a control circuit 452 configured to provision the bias voltages so as to be selectively provided by the bias circuit 450. For instance, the power amplifier circuit 440a is switched OFF when the control circuit 452 directs the bias circuit 450 to provide a zero bias voltage at the center tap of the secondary winding 420a to power OFF the power amplifier circuit 440a. When the input signal is being transmitted to a nearby node, 'm' number of power amplifiers of the power amplifier circuits 440a-440n are powered OFF, where, n>m>1, A distant node requires at most 'p' power amplifier circuits of the plurality of power amplifier circuits 440a-440n to be powered OFF, where n>m>p≥1.

The circuit 400 includes a matching network 460, a filter circuit including a capacitor 465 and an antenna 470. The matching network 460 (e.g., resistive network, filters, and the like) is coupled to the output terminals of the plurality of power amplifier circuits 440a-440n. In this embodiment, the matching network 460 is configured to receive amplified signals from output terminals of the plurality of power amplifier circuits 440a-440n. The matching network 460 is configured to provide the amplified signals to the antenna 470 for transmission. The capacitor 465 is coupled between the antenna 470 and ground 467, and eliminates the harmonic emissions introduced by the circuit 400. The capacitor 465 reduces the bandwidth of the amplified signals transmitted without loss of information by eliminating the harmonic emissions of the circuit 400. The antenna 470 receives the amplified signals from the plurality of power amplifier circuits 440a-440n and converts the amplified signals to radio waves for wireless transmission.

Figure 5:
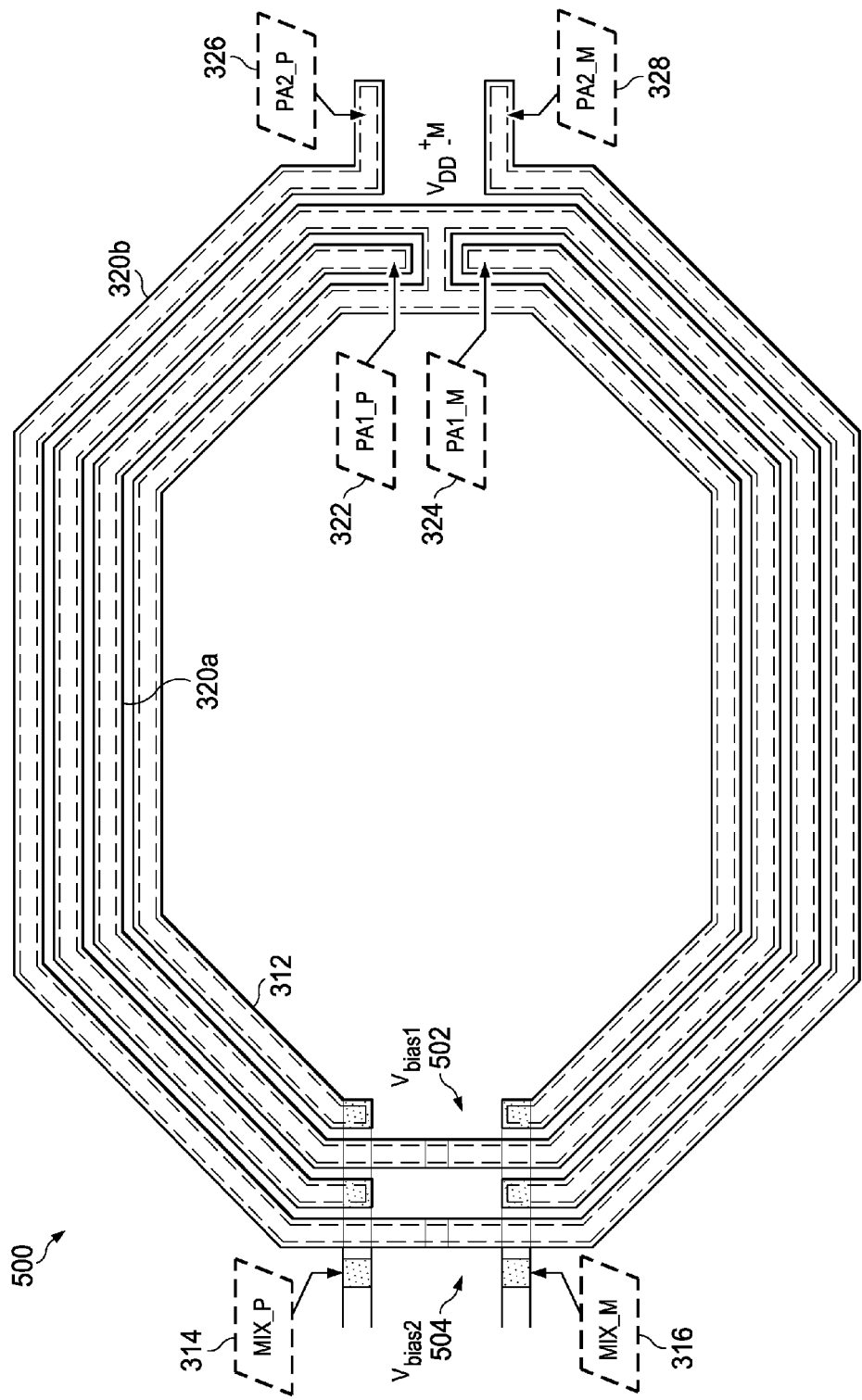
FIG. 5 is an example plan view layout of an example coupling circuit of a circuit configured for power control according to an embodiment.

Referring now to FIG. 5, a layout 500 depicts the details of the coupling circuit 310 including the primary winding 312 and the secondary windings 320a and 320b according to an embodiment. The layout 500 of FIG. 5 is herein described for the connections of the coupling circuit 310 described with reference to FIG. 3. The positive output terminal 304 of the driver circuit 302 is coupled to the positive input terminal 314 of the primary winding 312 (shown as, MIX_P) and the negative output terminal 306 of the driver circuit 302 is coupled to the negative input terminal 316 of the primary winding 312 (shown as, MIX_M). The secondary winding 320a is shown as a concentric shape within the primary winding 312. The positive terminal 322 (shown as, PA1_P) and the negative terminal 324 (shown as, PA1_M) of the secondary winding 320a are coupled to the first terminal 330 and the second terminal 332 of the PA1. The secondary winding 320b is shown as another concentric shape within the primary winding 312. The positive terminal 326 (shown as, PA2_P) and the negative terminal 328 (shown as, PA2_M) of the secondary winding 320b are coupled to the first terminal 334 and second terminal 336 of the PA2. The Vbias1 is provided at the center tap (see, 502) of the secondary winding 320a and the Vbias2 is provided at the center tap (see, 504) of the secondary winding 320b. The primary winding 312 and the secondary windings 320a and 320b are arranged in concentric circles in a layout which reduces the area compared to a conventional scheme shown in FIG. 2. The overlap of output terminals (a positive terminal and a negative terminal) of the driver circuit 202 with terminals (positive terminal and negative terminal) of the driver windings 208 and 214 in the coupling circuits 206 and 212 is avoided by using concentric windings.

Without in any way limiting the scope, interpretation, or application of the claims appearing below, effects of one or more of the example embodiments disclosed herein is to provide a circuit capable of providing power control of power amplifiers in a transmitter with a reduced area. The circuit consumes less power due to DC coupling of the coupling circuit with the power amplifier circuit. The circuit implementation utilizes a single coupling circuit having a primary winding and a plurality of secondary windings arranged in concentric shapes/circles, which reduces the area occupied by the coupling circuit and also avoids the negative and positive crossings. The gain of the circuit is considerably increased due to the absence of capacitances for coupling the secondary windings with the power amplifier circuits. The circuit is less complex compared to other conventional schemes and this reduces the signal loss due to absence of overlapping terminals. It should be noted that reference throughout this specification to features, advantages, or similar language does not imply that all of the features and advantages should be or are in any single embodiment. Rather, language referring to the features and advantages is understood to mean that a specific feature, advantage, or characteristic described in connection with an embodiment is included in at least one embodiment of the present technology. Thus, discussions of the features and advantages, and similar language, throughout this specification but do not necessarily, refer to the same embodiment.

Various embodiments of the present disclosure, as discussed above, are practiced with steps and/or operations in a different order, and/or with hardware elements in configurations which are different than those which are disclosed. Therefore, although the technology has been described based upon these example embodiments, it is noted that certain modifications, variations, and alternative constructions are apparent and well within the spirit and scope of the technology.

Although various example embodiments of the present technology are described herein in a language specific to structural features and/or methodological acts, the subject matter defined in the appended claims is not necessarily limited to the specific features or acts described above. Rather, the specific features and acts described above are disclosed as example forms of implementing the claims.

What is claimed is:

1. A circuit for power control of power amplifier circuits, the circuit comprising:
   a coupling circuit comprising a primary winding, a first secondary winding and a second secondary winding, the first secondary winding and the second secondary winding inductively associated with the primary winding, the coupling circuit configured to provide a signal at output terminals of the first secondary winding and output terminals of the second secondary winding, in response to an input signal received at the primary winding;
   a first power amplifier circuit coupled with the output terminals of the first secondary winding, wherein the first power amplifier circuit is configured to be enabled and disabled based on a first bias voltage selectively applied at the first secondary winding; and
   a second power amplifier circuit coupled with the output terminals of the second secondary winding, wherein the second power amplifier circuit is configured to be enabled and disabled based on a second bias voltage selectively applied at the second secondary winding.

2. The circuit of claim 1, wherein the primary winding comprises a positive input terminal and a negative input terminal, the circuit further comprising a driver circuit having a positive output terminal and a negative output terminal, the positive output terminal being coupled with the positive input terminal, the negative output terminal being coupled with the negative input terminal such that the driver circuit is electronically coupled with the primary winding and thereby configured to provide the input signal to the primary winding.

3. The circuit of claim 2, further comprising a tuning circuit coupled between the positive output terminal and the negative output terminal of the driver circuit to increase a gain of the driver circuit.

4. The circuit of claim 1, further comprising a bias circuit coupled with the first secondary winding and the second secondary winding, the bias circuit configured to selectively provide the first bias voltage to the first secondary winding and the second bias voltage to the second secondary winding.

5. The circuit of claim 4, further comprising a control circuit coupled with the bias circuit, the control circuit configured to provision the first bias voltage and the second bias voltage.

6. The circuit of claim 4, wherein each of the first secondary winding and the second secondary winding comprises a center tap, the first bias voltage being applied at the center tap of first secondary winding and the second bias voltage being applied at the center tap of the second secondary winding.

7. The circuit of claim 6, wherein the first power amplifier circuit is configured to be disabled when the first bias voltage applied at the first secondary winding is zero, and the second power amplifier circuit is configured to be disabled when the second bias voltage applied at the second secondary winding is zero.

8. The circuit of claim 1, wherein each of the first secondary winding and the second secondary winding comprises a positive terminal and a negative terminal, and each of the first power amplifier circuit and the second power amplifier circuits comprises a first terminal and a second terminal, the positive terminal of the first secondary winding and the positive terminal of the second secondary winding being coupled with the first terminal of the first power amplifier circuit and the first terminal of the second power amplifier circuit, respectively, and the negative terminal of the first secondary winding and the negative terminal of the second secondary winding being coupled with the second terminal of the first power amplifier circuit and the second terminal of the second power amplifier circuit, respectively.

9. The circuit of claim 1, further comprising:
a matching network coupled with the first power amplifier circuit and the second power amplifier circuit, the matching network configured to receive amplified signals from the first power amplifier circuit and the second power amplifier circuit.

10. The circuit of claim 9, further comprising:
an antenna coupled with the matching network, the antenna configured to receive the amplified signals from the matching network and wirelessly transmit the amplified signals.

11. A transmitter circuit, comprising:
a coupling circuit comprising a primary winding and a plurality of secondary windings inductively associated with the primary winding, the coupling circuit configured to provide a signal at output terminals of the plurality of secondary windings in response to an input signal received at the primary winding; and
a plurality of power amplifier circuits coupled with the output terminals of the plurality of secondary windings, wherein each power amplifier circuit is configured to be enabled and disabled based on a bias voltage selectively applied at a corresponding secondary winding.

12. The transmitter circuit of claim 11, wherein the primary winding comprises positive and negative input terminals, the circuit further comprising a driver circuit having a positive output terminal and a negative output terminal, the positive output terminal being coupled with the positive input terminal, the negative output terminal being coupled with the negative input terminal such that the driver circuit is electronically coupled with the primary winding and thereby configured to provide the input signal to the primary winding.

13. The transmitter circuit of claim 12, further comprising a tuning circuit coupled between the positive output terminal and the negative output terminal of the driver circuit to enhance the gain of the driver circuit.

14. The transmitter circuit of claim 11, further comprising a bias circuit coupled with the plurality of secondary windings, the bias circuit configured to selectively provide the bias voltages to the plurality of secondary windings, wherein each bias voltage is configured to control a corresponding power amplifier circuit.

15. The transmitter circuit of claim 14, further comprising a control circuit coupled with the bias circuit, the control circuit configured to provision the bias voltages.

16. The transmitter circuit of claim 14, wherein the plurality of secondary windings comprise center taps, the bias voltage being applied at the center tap of the corresponding secondary winding.

17. The transmitter circuit of claim 16, wherein a power amplifier circuit of the plurality of power amplifier circuits is disabled when the bias voltage provided to the corresponding secondary winding of the power amplifier circuit is a zero.

18. The transmitter circuit of claim 11, wherein each secondary winding of the plurality of secondary windings comprise positive and negative terminals, and each power amplifier circuit of the plurality of power amplifier circuits comprise first and second terminals, the positive terminal of the secondary winding being coupled with the first terminal of the power amplifier circuit, and the negative terminal of the secondary winding being coupled with the second terminal of the power amplifier circuit.

19. The transmitter circuit of claim 11, further comprising:
a matching network coupled with the plurality of power amplifier circuits, the matching network configured to receive amplified signals from the power amplifier circuits.

20. The transmitter circuit of claim 19, further comprising:
an antenna circuit coupled with the matching network, the antenna configured to receive the amplified signals from the matching network and wirelessly transmit the amplified signals.

* * * * *